(12) United States Patent
Kolesnikov et al.

(10) Patent No.: US 8,175,854 B2
(45) Date of Patent: May 8, 2012

(54) UNIVERSAL CIRCUIT FOR SECURE FUNCTION EVALUATION

(75) Inventors: Vladimir Kolesnikov, Union City, NJ (US); Thomas Schneider, Bochum (DE)

(73) Assignee: Alcatel Lucent, Paris (FR)

( * ) Notice: Subject to any disclaimer, the term of this patent is extended or adjusted under 35 U.S.C. 154(b) by 945 days.

(21) Appl. No.: 12/218,293

(22) Filed: Jul. 14, 2008

(65) Prior Publication Data
US 2009/0140767 A1    Jun. 4, 2009

Related U.S. Application Data

(60) Provisional application No. 61/004,712, filed on Nov. 29, 2007.

(51) Int. Cl.
*G06F 17/50* (2006.01)
*H03K 19/173* (2006.01)

(52) U.S. Cl. ............... 703/2; 703/13; 702/20; 700/101; 700/117; 326/38

(58) Field of Classification Search ............... 703/2, 13; 700/101, 117, 115; 702/20; 382/100; 714/755; 326/38
See application file for complete search history.

(56) References Cited

U.S. PATENT DOCUMENTS

| | | | |
|---|---|---|---|
| 6,934,388 B1 * | 8/2005 | Clark | 380/47 |
| 7,136,932 B1 * | 11/2006 | Schneider | 709/245 |
| 2005/0021319 A1 * | 1/2005 | Li et al. | 703/2 |
| 2007/0014428 A1 * | 1/2007 | Kountchev et al. | 382/100 |
| 2008/0103701 A1 * | 5/2008 | Xiao et al. | 702/20 |
| 2009/0112343 A1 * | 4/2009 | Yuan et al. | 700/101 |
| 2009/0112350 A1 * | 4/2009 | Yuan et al. | 700/117 |
| 2010/0235712 A1 * | 9/2010 | Bhushan | 714/755 |

OTHER PUBLICATIONS

Moni Naor et al.; Privacy Preserving Auctions and Mechanism Design; Association for Computing Machinery; 1999; pp. 129-139; E-Commerce 99; Denver, Colorado USA.
Abraham Waksman; A Permutation Network; Journal of the Association for Computing Machinery; Jan. 1968; pp. 159-163; vol. 15, No. 1; Stanford Research Institute; Menlo Park, CA; USA.
Leslie G. Valiant; Universal Circuits (Preliminary Report); Centre for Computer Studies; pp. 196-203; University of Leeds, Leeds, U.K.

* cited by examiner

*Primary Examiner* — Thai Phan
(74) *Attorney, Agent, or Firm* — Carmen Patti Law Group, LLC

(57) ABSTRACT

An exemplary method enables implementation of a universal circuit capable of emulating each gate of a circuit designed to calculate a function. A first selection module receives inputs associated with the function. It generates outputs that are an ordered series of the inputs. A universal module receives these outputs and generates another set of outputs. A second selection module receives the outputs from the universal module and generates final function outputs that are an ordered series inputs received from the universal module. The selection modules and universal module themselves are also aspects of the present invention.

12 Claims, 4 Drawing Sheets

UNIVERSAL CIRCUIT FOR SECURE FUNCTION EVALUATION

CROSS REFERENCE TO RELATED APPLICATION

This application claims the benefit of U.S. Provisional Application Ser. No. 61/004,712 filed Nov. 29, 2007, and entitled Secure Evaluation of Private Functions; it is incorporated herein.

BACKGROUND

This invention relates to secure function evaluation (SFE) of private functions and more specifically to universal circuits that simulate circuits of a known size that are capable of implementing SFE of private functions.

A need for a SFE of a two party function is illustrated as follows. Bob and Pat have respective inputs x and y that each desires to keep private from the other while calculating a function ƒ (x, y) having an output that is to be disclosed to both. An implementation of generic two-party SFE is disclosed in "Fairplay—a secure two-party computation system", D. Malkhi, N. Nisan, B. Pinkas, and Y. Sella, In USENIX, 2004. A need for a SFE of a two party private function is illustrated as follows. Bob and Pat have respective inputs x and y that each desires to keep private from the other while calculating a function ƒ (x, y), known only to Pat, having an output that is to be disclosed to both.

SUMMARY

An exemplary method enables implementation of a universal circuit capable of emulating each gate of a circuit designed to calculate a function. A first selection module receives inputs associated with the function. It generates outputs that are an ordered series of the inputs. A universal module receives these outputs and generates another set of outputs. A second selection module receives the outputs from the universal module and generates final function outputs that are an ordered series inputs received from the universal module.

The methods for implementing the selection modules and universal module themselves are also aspects of the present invention.

DESCRIPTION OF THE DRAWINGS

Features of exemplary implementations of the invention will become apparent from the description, the claims, and the accompanying drawings in which:

DETAILED DESCRIPTION

Figure 1:
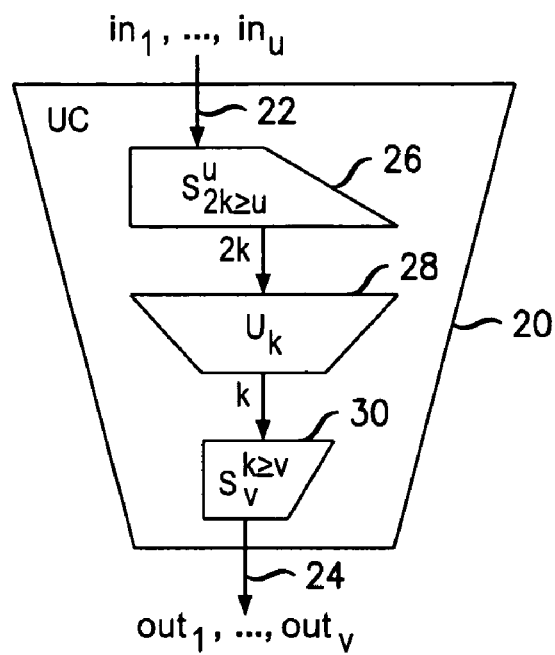
FIG. 1 is a block diagram of a universal circuit suited for incorporation of an embodiment of the present invention.

One aspect of the present invention resides in the recognition of the difficulties associated with a desire in some situations to keep the function itself secret and known only to one of the two parties. For example, credit evaluations, medical history checking and airport no-fly checking are types of functions in which it is desired that the function itself not be disclosed to one party, e.g. the party being evaluated, in order to prevent the parameters and weightings of the parameters from being disclosed. Keeping the function itself secret aids in preventing dishonest/malicious participants from attempting to exploit vulnerabilities in the calculation of the function/process, e.g. where the participant intentionally gives false information in order to attempt to achieve a desired outcome by the function. It is an objective of embodiments of the present invention to keep the function itself secret from one party. That is, the only information the one party will have access to about the function is the number of inputs and outputs, and size of the circuit implementing the function. The other party, i.e. the party with knowledge of the function itself, or that party's representative is responsible for programming the blocks (modules) of the universal circuit so that the desired function is executed.

By using a Universal Circuit (UC) instead of a function specific circuit, the function itself cannot be ascertained by observation of the UC prior to the UC being programmed to perform a desired function. A UC can be thought of as a "program execution circuit", capable of simulating any circuit C of certain size, given the description of C as input. Therefore, disclosing the unprogrammed UC does not reveal anything about C, except its size. A UC can compute a specific function while the specific circuit C remains private, since the player holding C simply treats the description (program defining the circuit to be emulated by the UC) of C as additional (private) input to the SFE of the UC.

The UC construction described herein directly results in improvements of private function SFE for many practical private functions of interest. Due to the size of UC constructions, the private function SFE is practical from a cost basis only for small circuits (UC for 5000-gate circuits has a size $10^6$, pushing the general SFE size limit). Therefore, improvements of circuit representation for a UC are particularly relevant for small circuits.

The UC described herein is advantageous in that it can be substantially smaller in size for circuits having approximately 5000 or fewer gates as compared with the construction of Valiant's UC; see Leslie G. Valiant, "Universal circuits (preliminary report)", *In Proc. 8th ACM Symp. on Theory of Computing*, pages 196-203, New York, N.Y., USA, 1976, ACM Press. UCs of the present invention have a size of approximately $1.5 \, k \log^2(k)$ where k is the number of gates. This should be contrasted with the Valiant construction of a UC which has an approximate size of $19 \, k \log(k)$.

FIG. 1 shows an exemplary universal circuit (UC) 20 that receives inputs 22 ($in_1 \ldots in_u$) and generates outputs 24 ($out_1 \ldots out_v$). The inputs are selected by a selection block 26, and processed by universal block 28 to produce outputs that are further selected by selection block 30 to generate the outputs 24.

In the exemplary UC construction, each gate $G_i$ of an original circuit C to be simulated is simulated by $UC_{u,v,k}$—a UC for k-gate circuits of u inputs and v outputs. That is, for each $G_i$, $UC_{u,v,k}$ has a corresponding programmable $G_i$-simulation gate $G_i^{Sim}$. In this construction, the inputs, outputs and semantics of $G_i^{sim}$ correspond to $G_i$. Additionally, the wiring of C is hidden by ensuring that every possible wiring can be implemented in $UC_{u,v,k}$. This method of construction of a UC is also employed by the Valiant construction.

The exemplary UC construction is designed recursively, meaning that a circuit is built from two circuits of smaller size. The universal block $U_k$ 28 can be viewed as a UC with specific input and output semantics. Namely, $U_k$ has 2k inputs and k outputs, since this is a maximum $UC_{u,v,k}$ can have. Further, we restrict that $U_k$'s inputs $in_{2i-1}$, $in_{2i}$ are only delivered to the simulation gate $G_i^{Sim}$, and $U_k$'s i-th output comes from $G_i^{Sim}$. However, input of some gates $G_i$ may come from any other gates' outputs, and not from $in_{2i-1}$ or $in_{2i}$, which may not be used at all; this is supported by $U_k$ which only restricts that $G_i$'s input cannot come from other $in_j$. $U_k$ is thus a UC for the class of circuits of size k with the above input/output restrictions.

To construct a $UC_{u,v,k}$ given an implementation of $U_k$, the input selection block 26 directs inputs 22 of the UC as an ordered arrangement (series) to the proper corresponding inputs of the $U_k$. The output selection block 30 directs the outputs from $U_k$ (inputs to block 30) as an ordered series to the proper outputs 24 of the UC, discarding unused outputs.

Figure 2:
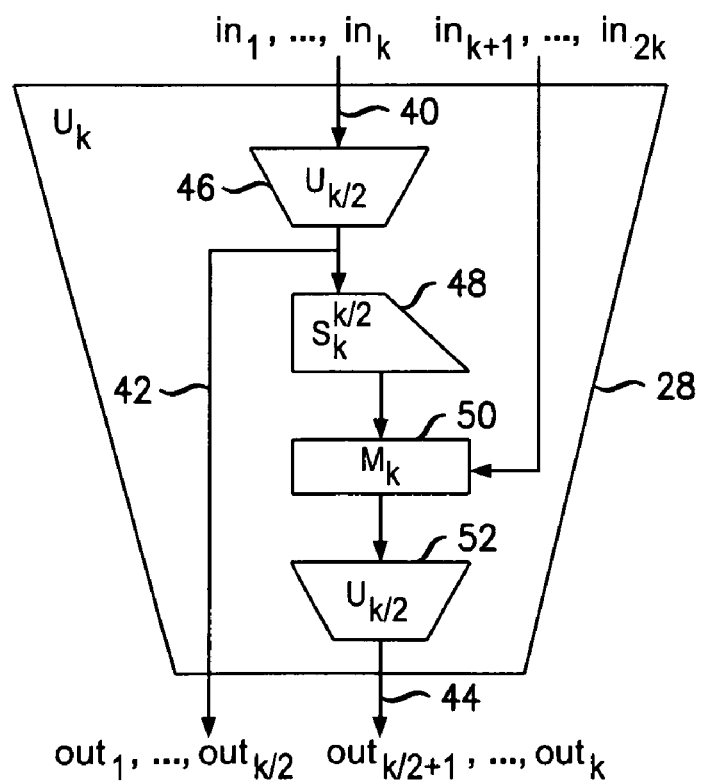
FIG. 2 is a block diagram of a recursive universal block in accordance with an exemplary embodiment of the present invention.

FIG. 2 is a block diagram of a recursive universal block in accordance with an exemplary embodiment of the present invention. It is constructed using a "divide and conquer" approach by which a universal block $U_k$ 28 can be constructed to simulate any circuit $C_k$ of size k, with the proper input/output restrictions stated above. The gates of circuit $C_k$ to be simulated are referred to by their index. The set of inputs 40 to $U_k$ 28 are divided into first and second sets, $in_1 \ldots in_k$ and $in_{k+1}, \ldots in_{2k}$. The first set of inputs 40 are processed by universal block 46 and sent as a first set of outputs 42 ($out_1, \ldots, out_{k/2}$) and also form inputs to selection block 48. A mixing block 50 mixes the outputs from universal block 46 with the second set of inputs ($in_{k+1}, \ldots, in_{2k}$) to produce outputs coupled to universal block 52 that in turn processes these inputs to produce the second set of outputs 44 ($out_{k/2+1}, \ldots, out_k$).

A topological order of gates $G_1, \ldots, G_k$ is selected so that the i-th gate $G_i$ has no inputs that are outputs of a successive gate $G_j$, where j>i. This ordering can always be obtained since only acyclic circuits are considered.

Now, suppose there are two blocks $U_{k/2}$, universal for circuits $C_{k/2}$ of size k/2 and it is desired to combine them to obtain $U_k$. Clearly, because of their universality, one of $U_{k/2}$ could simulate the "upper" half of $C_k$ (i.e. gates $G_1$ through $G_{k/2}$), and the other $U_{k/2}$ could simulate the lower half (gates $G_{k/2+1}, \ldots, G_k$). Note, that because of the topological ordering, there is no data going into the upper $U_{k/2}$ from the lower one. Thus, $U_k$ must only direct its inputs/outputs and allow implementation of all possible data paths from the upper U k/2 to the lower one. This can be done as shown on FIG. 2. This is described in more detail below.

The first k inputs 40 to $U_k$ $in_1, \ldots, in_k$ are directly sent to the upper $U_{k/2}$. The order of the inputs matches the interface perfectly, so no additional manipulation is required. The k/2 outputs of the upper universal block 46 $U_{k/2}$ are sent directly to the first half of the outputs 42 of $U_k$. Again, interfaces match, and no manipulation is required.

Now it is described how the inputs to the lower universal block 52 $U_{k/2}$ are provided. These inputs could come from any $G_i^{Sim}$ gate of the upper $U_{k/2}$. Therefore, the outputs 42 of upper $U_{k/2}$ are also wired as an input to selection block 48 $S_k^{k/2}$. This allows direction, with duplicates, of the output of any gate of upper $U_{k/2}$ to any position of the input interface of lower $U_{k/2}$ (and thus to any gate of lower $U_{k/2}$). Additionally, the universal block 52 inputs can come from the second set of $U_k$ inputs $in_{k+1}, \ldots, in_{2k}$ via the mixing block 50. Since the universal block 52 $U_{k/2}$ simulates gates $G_{k/2+1}$ through $G_k$ of $C_k$, inputs $in_{k+1}, \ldots in_{2k}$ are already ordered to match lower $U_{k/2}$'S interface. For each input to the universal block 52 $U_{k/2}$, the input is selected by the mixing block 50 to be one of the two available input wires: one provided by universal block 46 via selection block 48, and the other coming from the second set of inputs $in_{k+1}, \ldots, in_{2k}$. This is achieved for each input to universal block 52 by a corresponding programmable Y switch.

Figure 3:
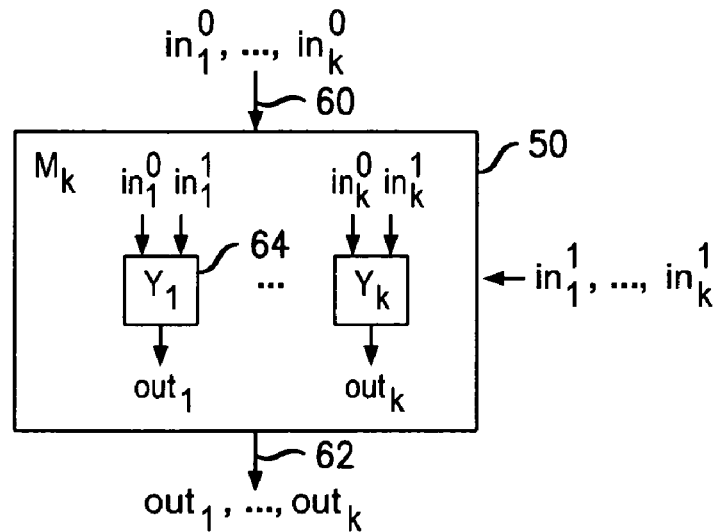
FIG. 3 is a block diagram of an exemplary mixing block as shown in FIG. 2.

FIG. 3 shows the mixing block 50 having k of the Y switches 64 with inputs 60 and outputs 62. Each Y switch is programmed to select one of two inputs $in_1, in_1^1, \ldots, in_k^0, in_k^1$ to be transferred to its output.

In accordance with the above, efficient methods of programming the UC are obtained, given a circuit $C_k$. If the first input of a gate $G_j$ in the lower half of $C_k$ (k/2<j≤k) is connected to an input of $C_k$, the mixing block 50 is programmed to select the corresponding input $in_{2j-1}$ (resp. $in_{2j}$) of $U_k$ by programming $Y_{2j-k-1}$ (resp. $Y_{2j-k}$) of mixing block 50 correspondingly. Otherwise, if $G_j$ is connected to an output of a gate $G_i$ in the upper half of $C_k$ (1≤i≤k/2), the mixing block 50 and selection block 48 are programmed to select the corresponding output from the upper $U_{k/2}$ block by programming $Y_{2j-k-1}$ (resp. $Y_{2j-k}$) correspondingly and programming selection block 48 with $\sigma_{2j-k-1}=i$ (resp. $\sigma_{2j-k}=i$).

Figure 4:
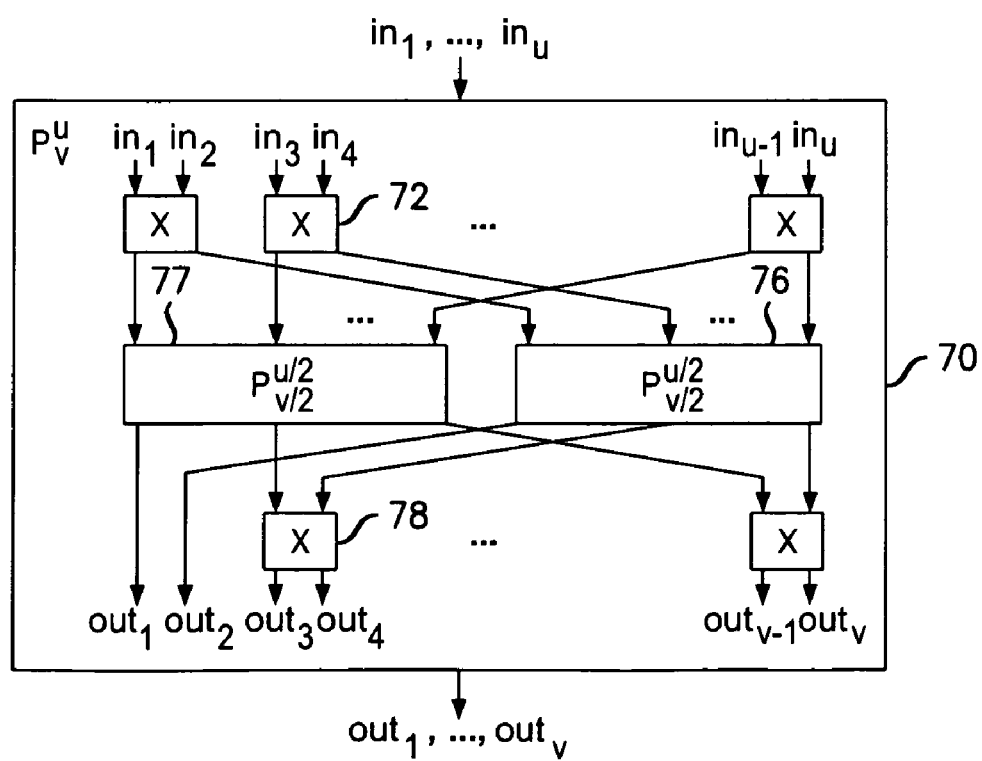
FIG. 4 is a block diagram of a known programmable permutation block.

FIG. 4 shows a previously known permutation block 70 $P_v^u$ that can be programmed to generate outputs that are any permutation of its inputs. In this example where u=v, pairs of inputs $in_1, in_2; \ldots; in_{u-1}, in_u$ are switched by X programmable switching blocks 72 that either routes the inputs straight through to corresponding outputs or causes the inputs to be crisscrossed to opposing outputs. One output of each block 72 is coupled to permutation matrix 74 and the other output is coupled to the other permutation matrix 76. Thus each permutation matrix handles a u/2×u/2 set of the u×u total. Pairs of outputs $out_1, out_2; \ldots; out_{v-1}, out_v$ are switched by X programmable switching blocks 78 that either routes the inputs straight through to corresponding final outputs or causes the inputs to be crisscrossed to opposing outputs. One input of each block 78 is coupled to permutation matrix 74 and the other input is coupled to the other permutation matrix 76. Block 70 can cause a set of inputs 1–u to be permutated into any desired order of outputs 1–v. For more details about permutation blocks, see Abraham Waksman, "A permutation network", *J. ADM*, 15(1): 159-163, 1968.

Figure 5:
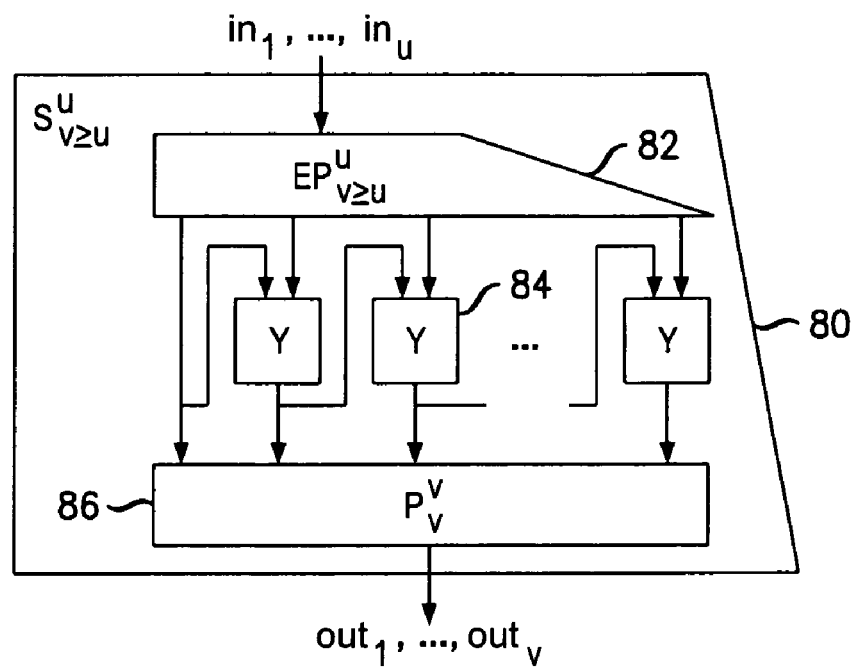
FIG. 5 is a block diagram of an exemplary selection block that includes an expanded permutation block.

FIG. 5 shows a selection block 80 $S_{v\geq u}^u$ that incorporates an expanded permutation block 82 $EP_{v\geq u}^u$, Y switching blocks 84, and a permutation block 86 $P_v^v$. This selection block 80 is suited for use as selection block 26 of UC 20. The expanded permutation block 82 permutes the u inputs to a subset of u of the v≥u outputs. The remaining (v–u) outputs are allowed to obtain any input value since these are intended to be later discarded, i.e. these are dummy outputs. An input mapping, expressed as a u×v matrix, specifies that the i-th input should be mapped to the $\mu_i$-th distinct output. The expanded permutation block 82 computes $EP(in_1, \ldots, in_u)$= ($out_1, \ldots, out_v$) where ($out_s=in_v$)←→($\mu_r=s$), s is in the set of {1, ..., v}, r is in the set of {1, ..., u}.

Each output of block 82, except for the 1st output which is coupled directly as an input to block 86, is coupled as one input of one of the respective Y switches 84. The other input to the Y switches is connected to the output of the preceding Y switch (viewed from left to right in FIG. 5). There are (v–1)

of the Y switches. The output of each Y switch is coupled as an input to permutation block 86 $P_v^v$.

To program selection block 80, first count the frequency of occurrence $c_j$ of each input value in the output: $c_j=\#\{\sigma_i: \sigma_i=j;$ i is in the set of $\{1 \ldots v\}\}$; j is in the set of $\{1, \ldots u\}$. Note, $0 \leq c_j \leq v$ and $\Sigma_{j=1}^u c_j = v$. The expanded permutation block 82 is programmed to:

1. map the needed inputs ($c_j \neq 0$) to its ($\Sigma_{k=1}^{j-1}$)-th output and
2. map the unused inputs ($c_j=0$) to an unused (dummy) output.

The Y switches enable the outputs of block 82 to be duplicated as inputs as necessary to the permutation block 86. If the right input of a Y block is a needed output, then the Y block selects it as its output which enables the next right Y switch to duplicate it as an output to block 86 if desired. Otherwise, the output of the left-neighbor Y block is selected. For each j, this construction inputs $c_j$ copies of $in_j$ into the permutation block 86. The permutation block 86 permutes these values to the corresponding outputs indicated by the selection mapping $\sigma$.

Figure 6:
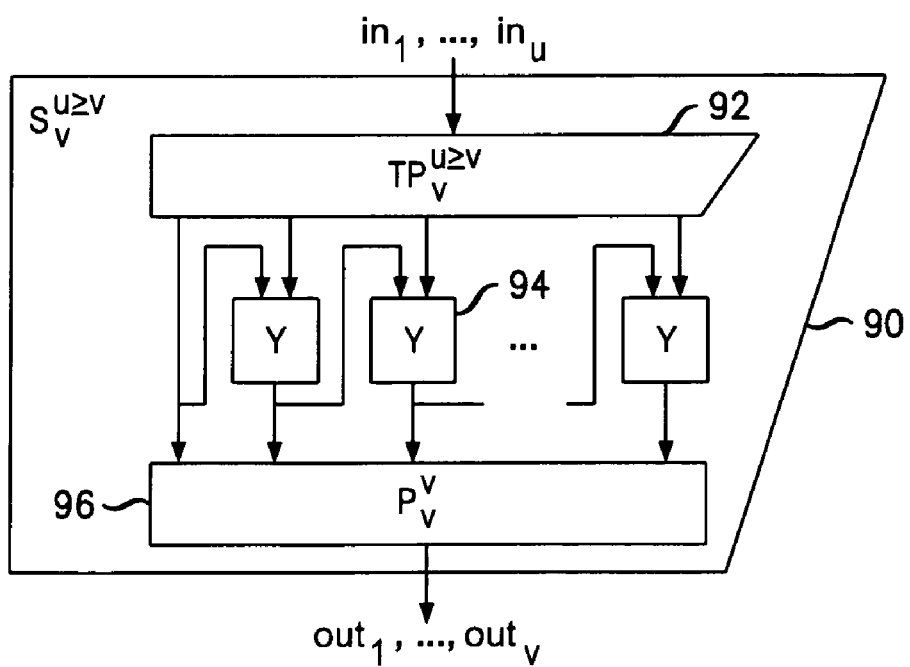
FIG. 6 is a block diagram of an exemplary selection block that includes a truncated permutation block.

FIG. 6 shows a selection block 90 $S_v^{u \leq v}$ that incorporates a truncated permutation block 92 $TP_v^{u \leq v}$, Y switching blocks 94, and a permutation block 96 $P_v^v$. This selection block 90 is suited for use as selection block 30 of UC 20. Each output of block 92, except for the 1$^{st}$ output which is coupled directly as an input to block 96, is coupled as one input of one of the respective Y switches 94. The other input to the Y switches is connected to the output of the preceding Y switch (viewed from left to right in FIG. 6). There are (v−1) of the Y switches. The output of each Y switch is coupled as an input to permutation block 96 $P_v^v$.

The truncated permutation block 92 permutes a subset of v of the u inputs to the $v \leq u$ outputs. The remaining u−v input values are discarded. An input mapping, expressed as a u×v matrix, specifies that the i-th input should be mapped to the $\mu_i$-th distinct output. An output mapping $(\mu_i)_{i=1}^v$, $\mu_i$ is in the set of $\{1, \ldots, u\}$, such that for all $j \neq i$: $u_i \neq u_j$ selects the $\mu_i$-th input as the i-ths output. The truncated permutation block computes $TP(in_1, \ldots, in_u)=(in_{\mu 1}, \ldots, in_{\mu v})$. The truncated permutation block 92 is recursively constructed. It is assumed that u and v are even at each recursion step (otherwise an unused dummy input or output with small overhead can be introduced). The truncated selection block of FIG. 6 can be constructed and programmed analogously to the expanded selection block of FIG. 5, but using the truncated permutation block 92 instead of the expanded permutation block 82.

Figure 7:
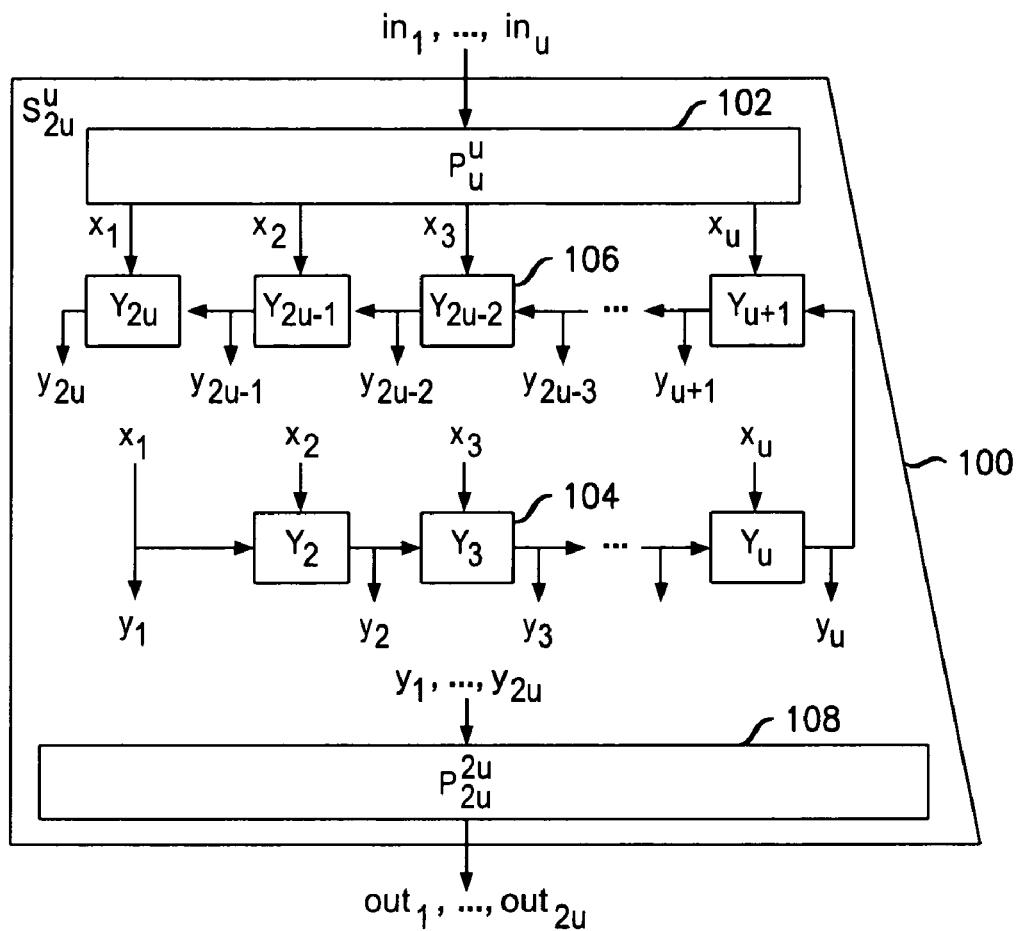
FIG. 7 is a block diagram of another exemplary selection block representing an optimization the selection block of FIG. 5.
Figure 8:
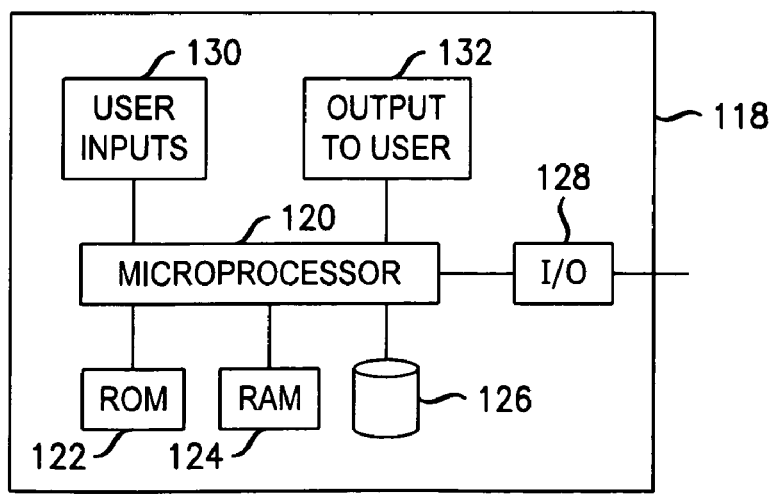
FIG. 8 is a block diagram of an exemplary computing system suited for implementing universal circuits in accordance with the present invention.

FIG. 7 is a block diagram of another exemplary selection block 100 representing an optimization the expanded selection block 80 of FIG. 5. In this example the selection block 100 is based on selection block 80 $S_{v \geq u}^u$ constructed for the case where v=2u which may be frequently used in the recursive construction of the universal block 28. Comparing the selection block 100 to selection block 80, the expanded permutation block 82 of selection block 80 is replaced with a smaller permutation block 102 of $P_u^u$, and a different arrangement of Y switching blocks 104, 106 is used instead of Y switching blocks 84.

Permutation block 102 together with the Y blocks 104, 106 can output the selected values of x (with the correct number of duplicates) in some order as outputs $Y_1 \ldots Y_{2u}$ coupled to permutation block 108. Arranging the outputs $Y_1 \ldots Y_{2u}$ into the desired order of $out_1, \ldots out_{2u}$ is the responsibility of permutation block 108. The permutation block 102 is programmed to deliver any input $in_i$ to any Y-layer input $x_j$ not already used by another input. For example, if input $in_i$ needs to be duplicated $c_i$ times, this can be achieved by programming the permutation to map $in_i$ to $x_j$, and have blocks $Y_j$ through $Y_{j+c-1}$ to output $x_j$. Thus way, the value of $in_i$ would be duplicated $c_i$ times. To enhance efficiency, the wiring of the Y-layer is limited. In particular, input $x_i$ is delivered only to blocks $Y_i$ and $Y_{2u-i+1}$, which are in a column i. From there, $x_i$ can be propagated "to the right" from $Y_i$ (i.e. to blocks $Y_{i+1}, \ldots$, in the lower row 104) and/or "to the left" from $Y_{2u-i+1}$ (i.e. to blocks $Y_{2u-i+2}, \ldots$, in the upper row 106). Note, blocks $Y_1$ and $Y_{2u-i+1}$ cannot receive different inputs from $P_u^u$ 102. However, blocks $Y_i$ and $Y_{2u-i+1}$ can produce different outputs, since one or both of them could be programmed to propagate the value of their neighboring Y block. This structure permits the Y-layer to be programmed, and the inputs $in_1 \ldots in_u$ to be permuted such that the Y-layer provides the desired number of duplicates for each input.

Specifically, the Y-layer is programmed as follows. For the i-th of u inputs of the selection block, let $c_i$ ($0 \leq c_i \leq u$) be the number of duplicates of that input to be produced by the Y lawyer. View the Y-layer as consisting of two rows (upper and lower), as depicted on FIG. 7. Due to the limited wiring, the Y-layer generates duplicates in a sequence. View each sequence of duplicates to be produced by the Y-layer as a "box" of size $c_i$ to be placed in either upper or lower row. Programming of the Y-layer is performed by first fitting the boxes of duplicates in the rows of the Y-layer (Algorithm 1 below). Then each Y block is programmed to implement input propagation according to the box layout.

---

Algorithm 1 (Box-packing)

---

0. Each box is always put in the leftmost unoccupied slots in the specified row.
1. Sort boxes by size $c_i$ in increasing order.
2. While there is at least one box of size 1, do
   a) if there are at least two boxes of minimal sizes s2 >= s1 >= 2 left
      i. put the box of size s1 in the upper row
      ii. put remaining (but no more than s1-2) boxes of size 1 in lower row
      iii. put the box of size s2 in the lower row (possibly wrap around
      iv. put remaining (but no more than s2-2) boxes of size 1 in upper row
   b) else
      i. put the remaining boxes of size 1 in the lower row
      ii. put the box of size s1 >= 2 in the lower row and wrap around
3. While there is at least one box of minimal size s3 >= 2 left, do
   a) if there is another box of minimal size s4 >= s3 >= 2 left
      i. put the box of size s3 in the upper row
      ii. put the box of size s4 in the lower row (possibly wrap around)
   b) else
      i. put the box of size s3 >= 2 in the lower row and wrap around

---

The permutation block 102 is then programmed to deliver the corresponding inputs to the beginning of each corresponding box in the Y-layer. The Y-layer, programmed as above creates the right numbers of duplicates, and the permutation block 108 is programmed to deliver each (duplicated) value to its intended destination.

A computing system 118, suitable for implementing a UC in accordance with the present invention, includes a microprocessor 120 that performs processes and tasks based on stored program instructions. It is supported by read-only memory (ROM) 122, random access memory (RAM) 124 and nonvolatile data storage device 126. As will be understood by those skilled in the art, data and stored program instructions in ROM 122 is typically utilized by microprocessor 120 to initialize and boot the computing apparatus. An application program, e.g. a program that controls the implementation of the UC including programming of individual block in the UC, can be stored in nonvolatile storage element 126. At least active portions of the application program will be typically stored in RAM 124 for ready access and processing by microprocessor 120. A variety of user inputs 130 such as a keyboard, keypad, and mouse can be utilized to input instructions to control the UC structure and its programming. User output devices 132 such as a display screen and/or printer provide a visual output, e.g. characters, that represent either information input by the user or information associated with an interim or final output of the UC. An input/output (I/O) module 108 provides a communication interface permitting microprocessor 120 to transmit and receive data with external nodes. Software that provides circuit emulations including different types of gates is known in general. Such software can be utilized to construct UCs in accordance with the described embodiments of the present invention.

Although exemplary implementations of the invention have been depicted and described in detail herein, it will be apparent to those skilled in the art that various modifications, additions, substitutions, and the like can be made without departing from the spirit of the invention. For example, the functions associated with the illustrative permutation modules, Y blocks, selection modules and UCs could be implemented in hardware circuits as well as in software although the latter facilitates easily changing the blocks or arrangement of blocks to produce a different corresponding function.

The scope of the invention is defined in the following claims.

We claim:

1. A method for implementing a universal circuit capable of emulating each gate of a circuit designed to calculate a function having u inputs, the method comprising the steps of
   receiving the u inputs by a first selection module;
   generating by the first selection module 2k outputs that are an ordered series of the u inputs, where u and 2k are integers and $2k \geq u$;
   receiving the 2k outputs of the selection module as inputs by a universal module;
   generating by the universal module k outputs based on the 2k inputs from the selection module;
   receiving the k outputs from the universal module as inputs by a second selection module;
   generating v outputs by the second selection module that are an ordered series of the k inputs from the universal module, where k and v are integers and $k \geq v$.

2. The method of claim 1 wherein the step of generating by the first selection module of the 2k outputs comprises the steps of:
   receiving the u inputs by a first permutation module that produces r outputs being an ordered series of the u inputs, where $r \geq u$;
   each of the r outputs being coupled to one of two inputs of corresponding Y switching gates each having an s output to which one of its two inputs is coupled, where the s output of a $Y_i$ gate is coupled to the other input of a $Y_{i+1}$ gate;
   receiving the s outputs as respective inputs by a second permutation module that produces 2k outputs being an ordered series of the s inputs.

3. The method of claim 2 wherein s=2k.

4. The method of claim 1 wherein the step of generating by the second selection module of the v outputs comprises the steps of
   receiving the k inputs by a first permutation module that produces r outputs being an ordered series of the k inputs, where $r \leq k$;
   each of the r outputs being coupled to one of two inputs of corresponding Y switching gates each having an s output to which one of its two inputs is coupled, where the s output of a $Y_i$ gate is coupled to the other input of a $Y_{i+1}$ gate;
   receiving the s outputs as respective inputs by a second permutation module that produces v outputs being an ordered series of the s inputs.

5. The method of claim 4 wherein s=v.

6. The method of claim 1 wherein the step of generating by the first selection module of the 2k outputs comprises the steps of:
   receiving the u inputs by a first permutation module that produces r outputs being an ordered series of the u inputs, where r=u;
   each of the r outputs being coupled to one of two inputs of one $Y_i$ switching gate, where $1 < i \leq r$, in a first series of (r-1) Y switching gates, each of the r outputs also being coupled to one of two inputs of one $Y_j$ switching gate, where $r < j \leq 2r$, in a second series of r number of Y switching gates, each Y switching gate in the first and second series having an s output to which one of its two inputs is coupled, where the s output of a Y switching gate is coupled to the other input of a next Y switching gate;
   receiving the s outputs as respective inputs by a second permutation module that produces 2k outputs being an ordered series of the s inputs.

7. The method of claim 1 wherein the step of generating by the universal module k outputs based on the 2k inputs comprises the steps of:
   receiving a first half of the 2k inputs by a universal module UC1;
   generating first set of outputs m by the universal module UC1 based on the first half of the 2k inputs, where m=k/2, the m outputs representing a first half of the k outputs;
   receiving the m outputs as inputs by a selection module S1;
   generating a set of outputs n by the selection module S1 based on the m inputs;
   receiving a second half of the 2k inputs by a mixing module, also receiving the n outputs as inputs by the mixing module, the mixing module having n number of Y switching gates with each of the latter having two inputs and an output to which one of its two inputs is coupled, one input of the Y switching gates receiving one of the second half of the 2k inputs and the other of the Y switching gates receiving one of the n outputs;
   generating a set of outputs p by the mixing module where each p output is selected to be one of the two inputs to each Y switching gate;
   receiving the p outputs as inputs q by a selection module S2;
   generating a set of outputs by the selection module S2 based on the q inputs, the outputs by the selection module S2 representing a second half of the k outputs.

8. A method for implementing a selection module for use in constructing a universal circuit comprises the steps of
   receiving u inputs by a first permutation module that produces r outputs being an ordered series of the u inputs, where $r \geq u$;
   each of the r outputs being coupled to one of two inputs of corresponding Y switching gates in a series of Y switching gates, each Y switching gate having an s output to which one of its two inputs is coupled, where the s output of one Y switching gate is coupled to the other input of a next Y gate in the series of Y switching gates;

receiving the s outputs as respective inputs by a second permutation module that produces 2k outputs being an ordered series of the s inputs.

9. The method of claim 8 wherein s=2k.

10. A method for implementing a selection module for use in constructing a universal circuit comprises the steps of
receiving k inputs by a first permutation module that produces r outputs being an ordered series of the k inputs, where $r \leq k$;
each of the r outputs being coupled to one of two inputs of corresponding Y switching gates in a series of Y switching gates, each Y switching gate having an s output to which one of its two inputs is coupled, where the s output of one Y switching gate is coupled to the other input of a next Y gate in the series of Y switching gates;
receiving the s outputs as respective inputs by a second permutation module that produces v outputs being an ordered series of the s inputs.

11. The method of claim 10 wherein s=v.

12. A method for implementing a selection module for use in constructing a universal circuit comprises the steps of
receiving u inputs by a first permutation module that produces r outputs being an ordered series of the u inputs, where r=u;
each of the r outputs being coupled to one of two inputs of one $Y_i$ switching gate, where $1 < i \leq r$, in a first series of (r-1) Y switching gates, each of the r outputs also being coupled to one of two inputs of one $Y_j$ switching gate, where $r \leq j \leq 2r$, in a second series of r number of Y switching gates, each Y switching gate in the first and second series having an s output which is one of its two inputs, where the s output of a Y switching gate is coupled to the other input of a next Y switching gate;
receiving the s outputs as respective inputs by a second permutation module that produces 2k outputs being an ordered series of the s inputs.

\* \* \* \* \*